(12) United States Patent  
Rudin

(10) Patent No.: US 8,399,179 B2  
(45) Date of Patent: Mar. 19, 2013

(54) HIGH ASPECT RATIO MICROSTRUCTURES

(75) Inventor: John Christopher Rudin, Bristol (GB)

(73) Assignee: Hewlett-Packard Development Company, L.P., Houston, TX (US)

( * ) Notice: Subject to any disclaimer, the term of this patent is extended or adjusted under 35 U.S.C. 154(b) by 334 days.

(21) Appl. No.: 12/865,506

(22) PCT Filed: Apr. 24, 2008

(86) PCT No.: PCT/EP2008/055024
§ 371 (c)(1),
(2), (4) Date: Jul. 30, 2010

(87) PCT Pub. No.: WO2009/129858
PCT Pub. Date: Oct. 29, 2009

(65) Prior Publication Data
US 2010/0330502 A1    Dec. 30, 2010

(51) Int. Cl.
*G03F 7/20* (2006.01)
(52) U.S. Cl. .................. 430/311; 264/241
(58) Field of Classification Search .............. 430/311; 264/241
See application file for complete search history.

(56) References Cited

U.S. PATENT DOCUMENTS
6,093,520 A    7/2000 Vladimirsky
2008/0296803 A1*  12/2008 Lee et al. ............. 264/264

OTHER PUBLICATIONS

"X-Ray Lithography".
"LIGA Technology".
XP-002515732.

* cited by examiner

Primary Examiner — Brittany Raymond

(57) ABSTRACT

A method for forming a high aspect ratio microstructure (20) comprises:
a) forming on a conductive surface (4) of a carrier substrate (3) one or more dielectric structures (6) to create a mandrel (7);
b) forming masking material (8) by electrodepositing on exposed areas of the conductive surface of the mandrel one or more metal structures;
c) forming a composite structure (18) by taking a photopolymer structure comprising a substrate (12) having thereon an electromagnetic radiation-sensitive photopolymer of either a positive tone or a negative tone (14), the photopolymer having a thickness substantially equal to the desired height of the microstructure to be formed, and adhering the photopolymer to the masking material (8), wherein the masking material is opaque to the electromagnetic radiation;
d) removing the carrier (3);
e) exposing the photopolymer (14) to electromagnetic radiation so as to irradiate regions of the photopolymer corresponding to the one or more dielectric structures (6) and substantially not to irradiate regions of the photopolymer corresponding to the one or more metal structures (8); and
f) developing to selectively remove those portions of the photopolymer exposed to the radiation if the photopolymer has a positive tone; or to selectively remove the unexposed portions of the photopolymer if the photopolymer has a negative tone, thereby forming a high aspect ratio microstructure (20).

The invention also provides a composite structure (18) for use in the method.

17 Claims, 6 Drawing Sheets

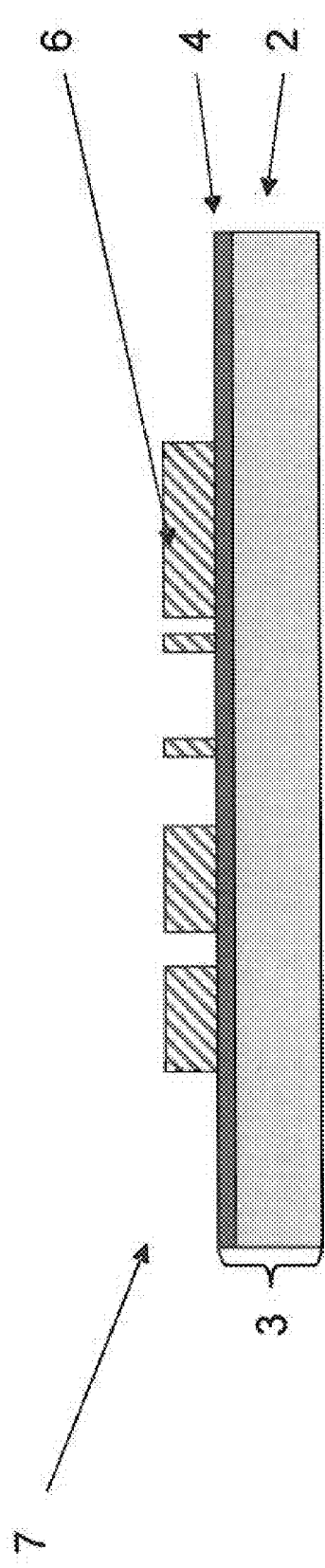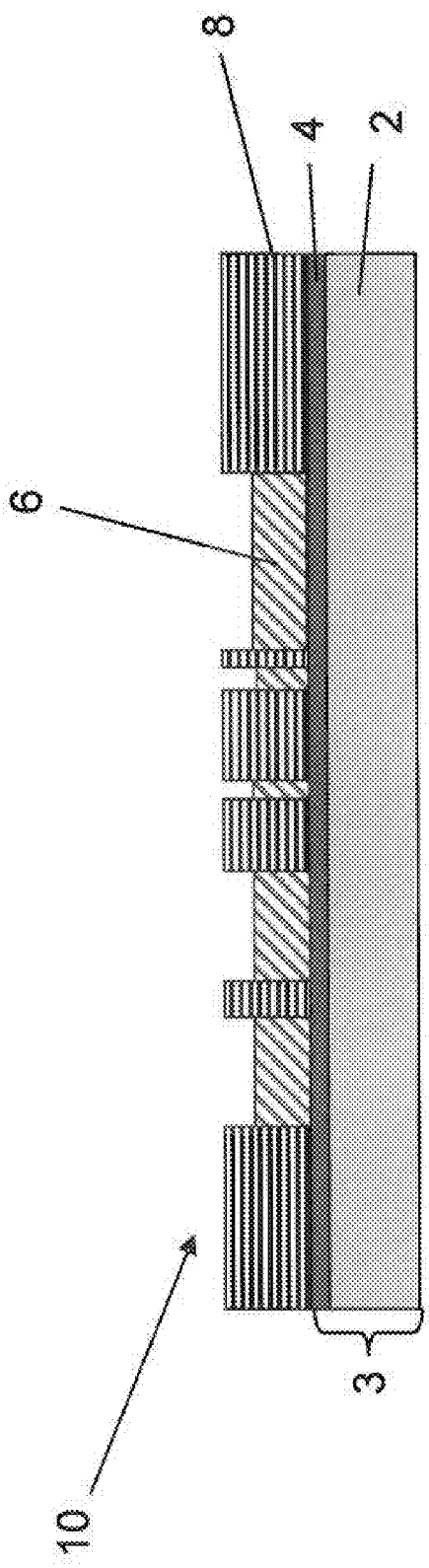

HIGH ASPECT RATIO MICROSTRUCTURES

X-ray LIGA is a technique for generating very high aspect ratio microstructures in reactive photo-polymers. The microstructures may be used to electroform inverse structures in metal, for use as mould tools or directly as micro parts. Alternatively the polymer microstructures can be used themselves as micro parts in optics, microfluidics, MEMS and the like. The term LIGA is derived from: Lithographie, Galvanoformung (electroplating) and Abformung (moulding).

The technique was developed in the 1980's but has had little commercial impact, mainly due to the limited access to high fluence collimated X-ray sources such as synchrotrons. Originally a simple PMMA material was used as the photopolymer and could take many hours to expose to a level where solvents could be used to remove the exposed material. More recently a negative tone chemically amplified epoxy-based resist (SU8—MicroChem Corporation) has been used [Malek, C. G., Microelectronics Journal 33 (2002) 101-105], which has a significantly higher sensitivity (×200), bringing exposure times down to minutes and making the process more cost effective. In either case, a restricting issue is the x-ray mask. Typically these are fabricated by ebeam exposure of traditional photoresist to pattern 'thick' (4-20 µm) gold structures on a 'thin' (<200 µm) beryllium or Kapton substrate. There are no commercial sources of these masks, and typically they are fragile and subject to exposure damage.

An additional problem is that the mask to substrate gap remains relatively large to avoid any physical contact between the mask and coated substrate. Whilst this does not cause a significant optical problem when using x-rays at normal incidence, it requires the exposure fixture to be placed in a vacuum chamber to avoid x-ray scattering from oxygen and nitrogen in the air, thus leading to issues of substrate heating and the problems associated with vacuum handling. Where oblique irradiation is used to form more complex structures, the mask to substrate distance is critical and a high degree of repeatability is desirable.

To address these problems, attempts have been made to place a metal masking layer directly onto the photopolymer surface, for example as described in U.S. Pat. No. 6,093,520. This has the advantage of removing any gap between the photopolymer and the mask, and reduces the issue of x-ray absorption in the mask carrier material. This permits lower exposure times and gives higher contrast in the exposure However, the formation of a metal layer on top of the photopolymer surface and subsequent patterning by UV lithography and etch or lift-off is problematic for uncured materials, and is inherently slow.

Aspects of the present invention are specified in the independent claims. Preferred features are specified in the dependent claims.

The term 'high aspect ratio microstructure' is used herein to denote a structure which is tall and thin: for example, having a minimum feature size of 10 µm or smaller and an aspect ratio of 20 or greater.

The invention provides a sacrificial electroformed mask which is adhesively transferred to the surface of a photopolymer from a reusable mandrel. This has many advantages including the ability to prepare film-based substrates for x-ray or other electromagnetic radiation exposure.

BRIEF DESCRIPTION OF THE DRAWINGS

The invention will now be further described, by way of example only, with reference to the following drawings in which:

FIGS. 1-6 show stages in the formation of a high aspect ratio microstructure in accordance with embodiments of the invention.

DETAILED DESCRIPTION

Figure 3:
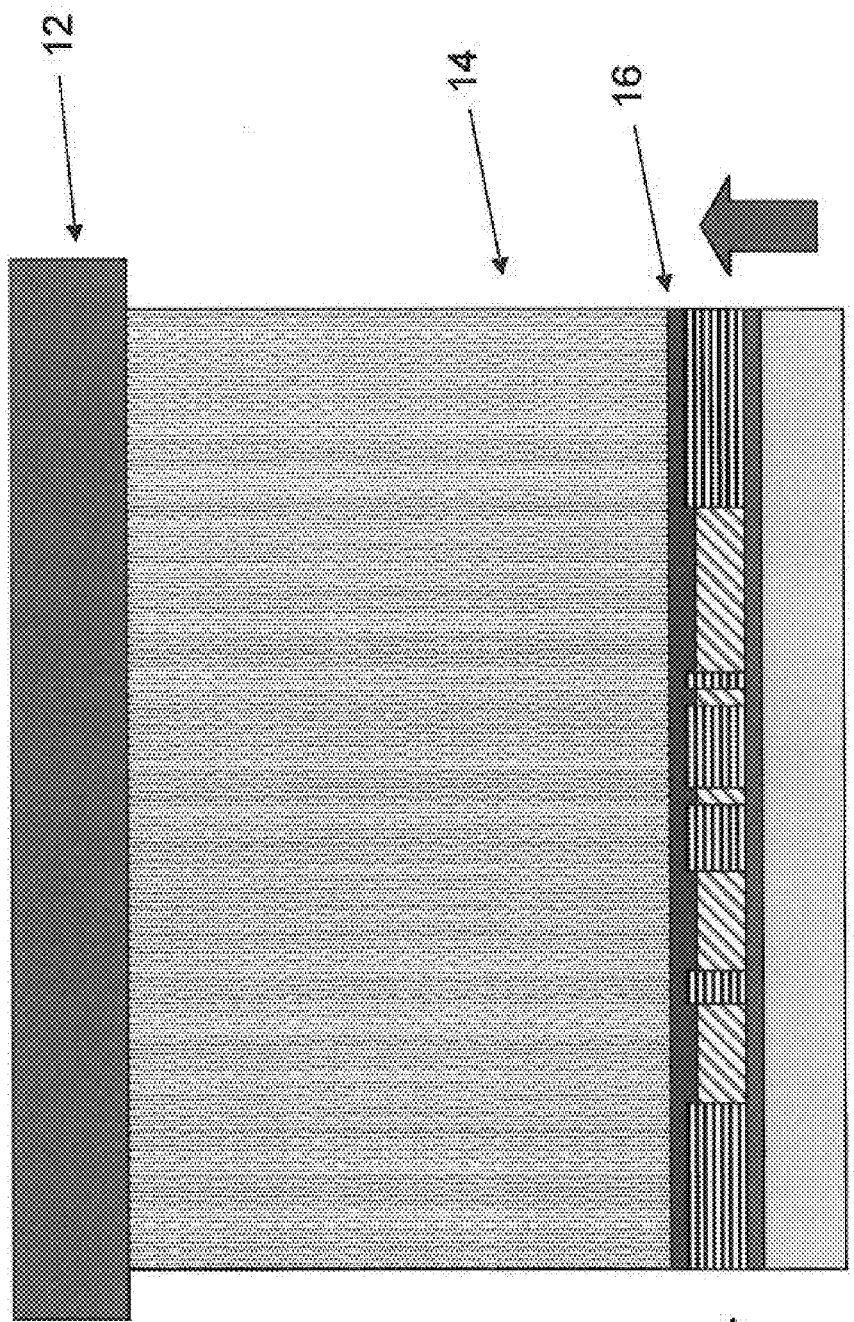

Referring to FIG. 1, a conformal or rigid carrier 3 has a conductive surface. A pattern of low aspect ratio dielectric structures 6 is provided on the conductive surface by any suitable technique, and the combination is referred to as the mandrel 7. Known techniques such as lithography or, preferably, micromoulding may be used to form the dielectric structures 6. In this embodiment the conductive carrier 3 comprises a polymer support film 2 which has a conductive layer 4 to provide the conductive surface. The conductive layer 4 may be a thin (for example 1-2 µm) metal coating. In an alternative embodiment the conductive carrier 3 may comprise a single metal film. The support film 2, conductive layer 4, and low aspect ratio dielectric structures 6 may all be substantially opaque to x-rays. The thickness of the carrier 3 is typically 100-150 µm. The dielectric structures 6 are typically 2-4 µm tall. In one example the carrier 3 is formed of nickel metal, and the dielectric structure is formed by the standard UV photolithography of SU-8. The exposed conductive surface, in this example the exposed surface of the conductive layer 4, is preferably treated to control adhesion and exhibit good release from subsequently electroformed metal. Suitable surface treatments, e.g. dipping in 0.1N potassium dichromate solution for 5 minutes, will be known to those skilled in the art of electroforming.

A mask 10 is formed, as shown in FIG. 2, by electroforming metal onto the mandrel 7, to form structures 8 adjacent to the dielectric structures 6 and to substantially the same height as, or preferably slightly greater than the dielectric structures 6. Any suitable metal may be used; preferred metals are nickel, copper or gold. The metal structures 8 are substantially opaque to the electromagnetic radiation to be employed, in this example x-rays.

Referring now to FIG. 3, a composite structure 18 is formed by adhering the metal structures 8 of the mask 10 to an x-ray photopolymer 14 on a LIGA substrate 12. The LIGA substrate 12 may optionally be conductive. Any suitable x-ray photopolymer may be used, for example PMMA or SU8. The photopolymer 14 may be of either positive or negative tone. In this example, the photopolymer 14 is preferentially adhered to the surface of the mask 10 which is provided by the metal structures 8 and not to the low aspect ratio dielectric structures 6. The adhesion in this example is provided by a transfer adhesive layer 16, typically of less than 5 µm thickness and substantially transparent to the electromagnetic radiation to be employed; in this example x-rays. In an alternative embodiment, the uncured photopolymer 14 may have sufficient tack to provide adhesion to the mask without the need for a separate adhesive layer. The thickness of the photopolymer layer 14 corresponds to the desired height of the final microstructures. For high aspect ratio structures the thickness of the layer 14 may be from 5 µm to 2000 µm, but is preferably in the region of 50-100 µm. The LIGA substrate 12 is preferably metal, e.g. nickel or stainless steel, either as a metal shim, or a coating on a rigid silicon or glass substrate to allow subsequent electroforming of structures within the structures formed by the LIGA process.

Figure 4:
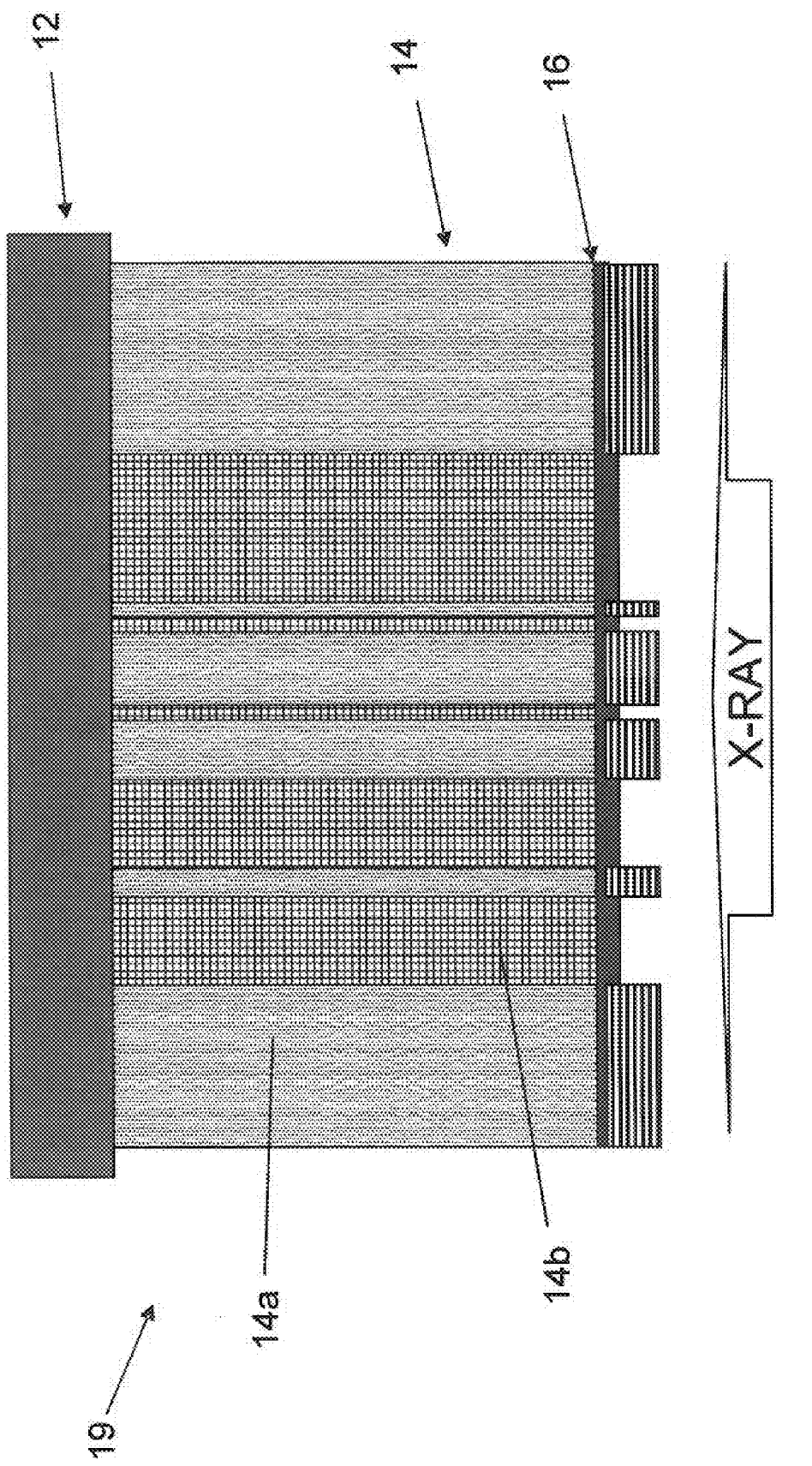

The carrier 3, and preferably the dielectric structures 6, i.e. the complete mandrel 7, are then removed from the composite structure 18 to leave a masked structure 19, comprising the metal structures 8 in contact with the photopolymer layer 14, as shown in FIG. 4. If the dielectric structures 6 are not removed from the composite structure 18 they must be made from a material that is transparent to the electromagnetic radiation to be employed; in this example, x-rays.

At this stage the carrier 3 may be re-used. In the preferred embodiment wherein the entire mandrel 7 is removed, it can be cleaned, prepared and re-used many times, e.g. in a semi-continuous fashion.

The photopolymer 14 is then exposed to electromagnetic radiation; in this example consisting of x-rays so as to irradiate regions 14b of the photopolymer corresponding to the dielectric structures 6. The metal structures 8 are opaque to x-rays, so that regions 14a of the photopolymer that correspond to the metal structures are substantially not irradiated. Subsequent to exposure, some photopolymer materials will require thermal processing to crosslink the polymer.

Figure 5:
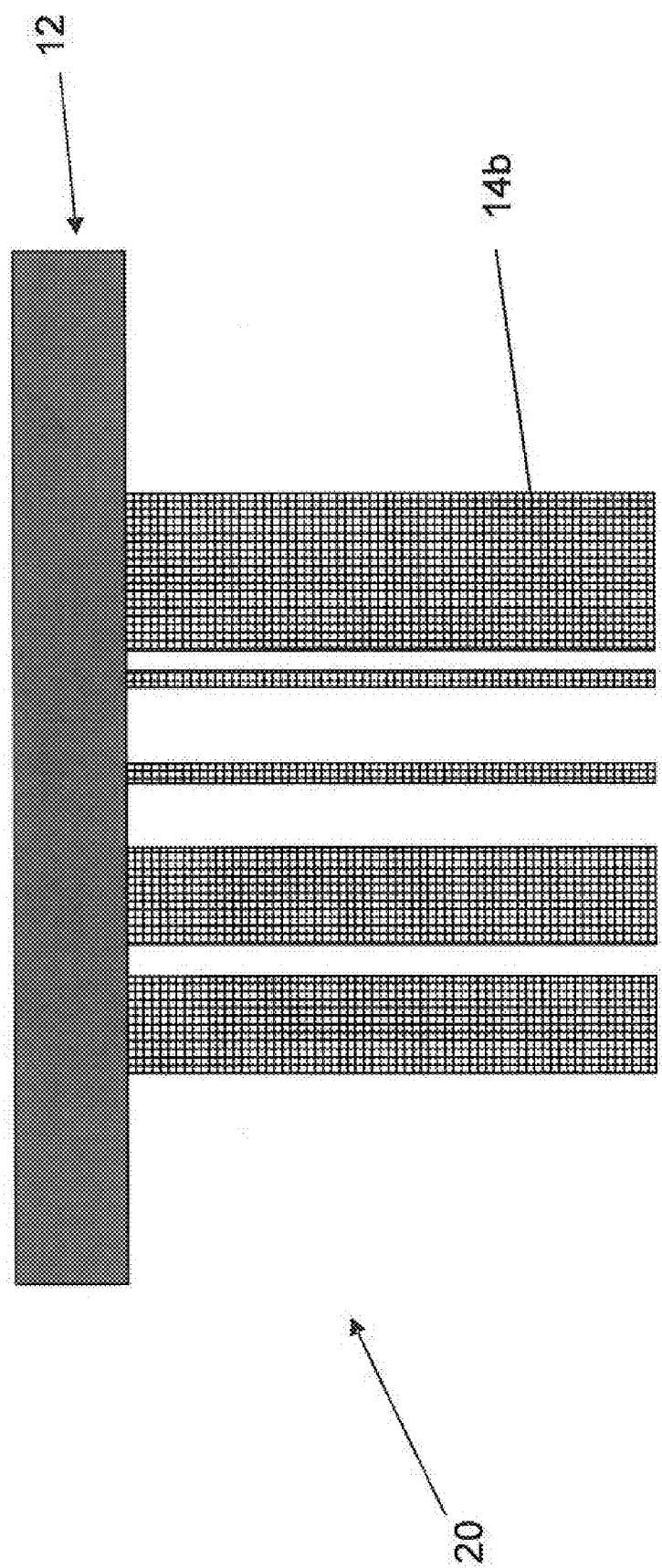

The metal structures 8 and the optional transfer adhesive layer 16 may then be removed by wet etching, solvent rinsing or dry etching. For a 'negative tone' photopolymer the unexposed material is removed using a suitable solvent or chemical developer, to leave a high aspect ratio microstructure 20 (FIG. 5).

Figure 6:

In this example, the photopolymer 14 has a negative tone similar to SU8, and the developer selectively leaves portions of the photopolymer 14b that have been crosslinked by a photoacid formed by the exposure to x-rays and subsequent thermal processing. If a photopolymer of positive tone is used instead, the polymer solubility is raised by exposure to x-rays, and the developer will selectively remove portions of the photopolymer 14b that have been exposed to the x-rays (FIG. 6).

Figure 7:
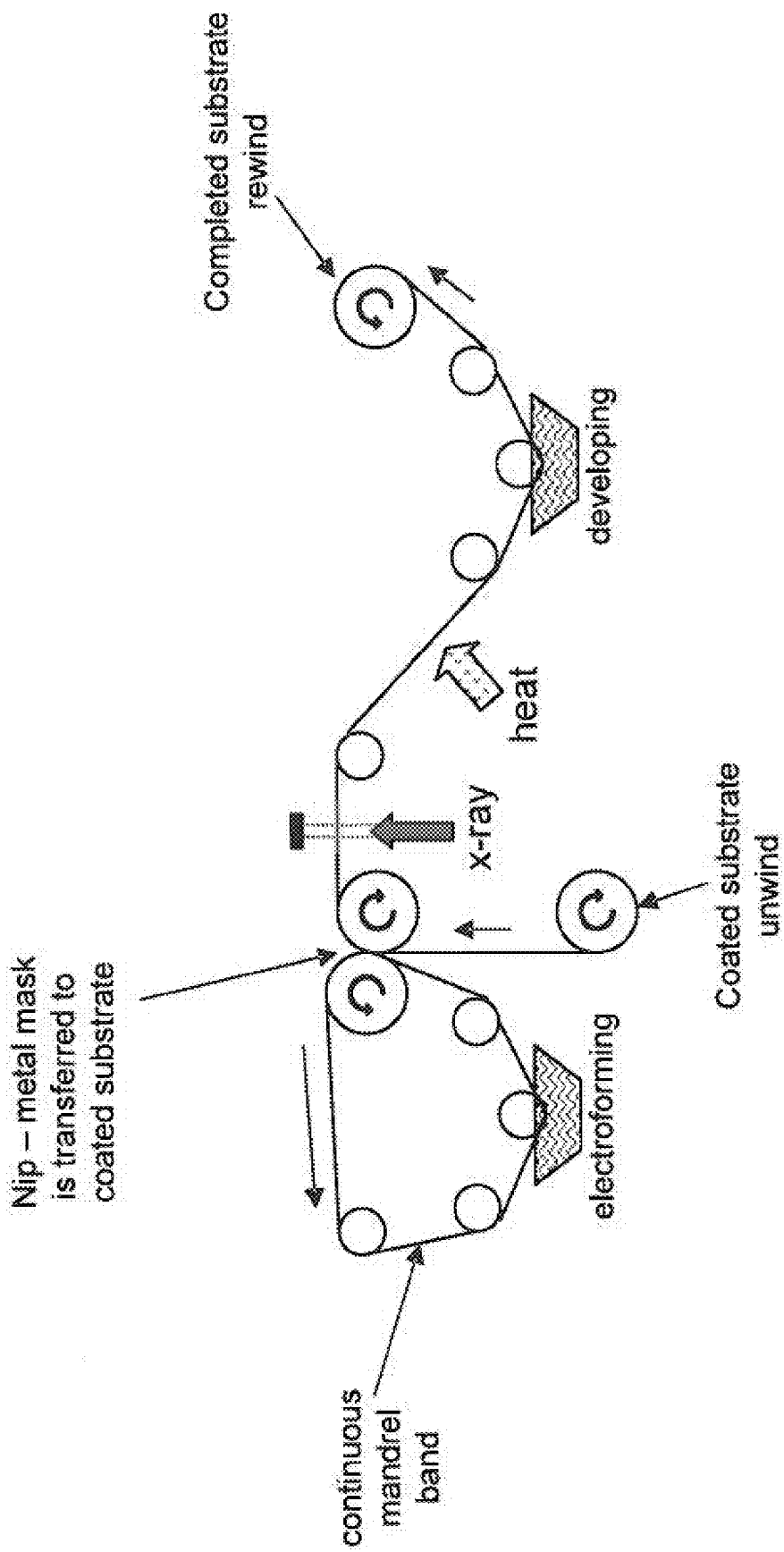
FIG. 7 illustrates a continuous or semi-continuous process for forming a high aspect ratio microstructure in accordance with another embodiment of the invention.

Any or all of the steps described above can be carried out in a semi-continuous fashion. FIG. 7 illustrates how the process of forming a metal pattern from a mandrel belt can be incorporated into a continuous patterning process. In the arrangement of FIG. 7 the mandrel is in the form of a continuous belt, on which the metal mask is formed and transferred to the coated substrate. The masked substrate is illuminated by x-ray, thermally crosslinked and developed prior to being rewound. Whilst these steps are shown as immediately sequential, a significant advantage of reel to reel processing is that they can be split into individual steps each with its own unwind and rewind stations.

The invention provides a number of advantages over the prior art.

The original mandrel 7 can be re-used to fabricate sacrificial masks for many substrates, avoiding any exposure damage.

The mask material may be electroformed at high speed and low cost, making it suitable for reel to reel processing.

The mask has a high contrast ratio because the exposed areas have substantially no absorption.

The technique is applicable to patterning photopolymers on film or other conformal substrates.

The sacrificial mask can be formed onto many substrates, or a continuous length of film before entering the x-ray exposure system. This maximises the throughput in one of the most expensive steps, allowing for a semi-continuous exposure of a film substrate as it is moved across the typical 'slit' x-ray beam from a synchrotron source.

Direct contact between the mask and the photopolymer allows exposures to be carried out in air or helium atmospheres, removing the need for a vacuum chamber around the exposure system.

The mask/photopolymer alignment is guaranteed through temperature changes and allows for repeatable off-axis illumination for single or multiple exposures through the same mask. This is important for producing controlled side-wall angles in high aspect ratio mould tooling.

This technique of masking will enable x-ray LIGA to be used with flexible substrates and substantially reduce the overall process time and cost. High aspect ratio LIGA may find application in display technology, printhead and microsystem component manufacture.

While the invention has for convenience been exemplified with reference to an x-ray sensitive photopolymer, it will be understood that the invention is not limited to the use of x-rays. Other types of radiation known to those skilled in the art of photolithography may alternatively be used: for example ultraviolet light (UV—LIGA), notably deep ultraviolet (DUV) or extreme ultraviolet (EUV).

The articles 'a' and 'an' are used herein to denote 'at least one' unless the context otherwise requires.

The invention claimed is:

1. A method for forming a high aspect ratio microstructure, the method comprising:
   a) forming on a conductive surface of a carrier substrate one or more dielectric structures to create a mandrel;
   b) forming masking material by electrodepositing on exposed areas of the conductive surface of the mandrel one or more metal structures;
   c) forming a composite structure by taking a photopolymer structure comprising a substrate having thereon an electromagnetic radiation-sensitive photopolymer of either a positive tone or a negative tone, the photopolymer having a thickness substantially equal to the desired height of the microstructure to be formed, and adhering the photopolymer to the masking material, wherein the masking material is opaque to the electromagnetic radiation;
   d) removing the carrier substrate to leave a masked structure;
   e) exposing the photopolymer to electromagnetic radiation to which it is sensitive so as to irradiate regions of the photopolymer not corresponding to the one or more metal structures and substantially not to irradiate regions of the photopolymer corresponding to the one or more metal structures; and
   f) developing to selectively remove those portions of the photopolymer exposed to the radiation if the photopolymer has a positive tone; or to selectively remove the unexposed portions of the photopolymer if the photopolymer has a negative tone, thereby forming a high aspect ratio microstructure.

2. A method according to claim 1, wherein the one or more metal structures are taller than the one or more dielectric structures.

3. A method according to claim 1 or claim 2, wherein the photopolymer has a tacky surface and wherein the surface tack is used to adhere the photopolymer to a surface of the metal structures.

4. A method according to claim 1, wherein the masking material metal is nickel, copper or gold.

5. A method according to claim 1, wherein the carrier substrate is flexible.

6. A method according to claim 1, wherein the carrier substrate comprises a continuous length of film.

7. A method according to claim 6, wherein the radiation comprises x-rays and wherein the step of exposing the photopolymer to the electromagnetic radiation is carried out by moving the masked structure across an x-ray beam from a synchrotron source.

8. A method according to claim 1, wherein the mandrel is removed in step d).

9. A method according to claim 8, further comprising re-using the removed mandrel to form a further masked structure as specified in steps b) to d).

10. A method according to claim 1, further comprising the step of removing the masking material after step e).

11. A method according to claim 1, wherein the conductive surface is treated to reduce adhesion to the electroformed metal and facilitate release of the carrier in step d).

12. A method according to claim 1, wherein the exposure to the radiation is carried out in an atmosphere of air or helium.

13. A method according to claim 1, wherein the electromagnetic radiation comprises x-rays.

14. A method according to claim 1, wherein the electromagnetic radiation comprises ultraviolet rays.

15. A composite structure for use in making a high aspect ratio microstructure, the composite structure comprising:
 a carrier substrate which has a conductive surface;
 one or more dielectric structures and one or more metal structures, said structures being provided adjacent to one another on the conductive surface;
 a layer of an electromagnetic radiation-sensitive photopolymer adhered to the metal structures; and
 a substrate adhered to a major surface of the photopolymer;
 wherein the one or more metal structures is opaque to electromagnetic radiation to which the photopolymer is sensitive.

16. A composite structure according to claim 15, wherein the photopolymer is adhered to both the one or more dielectric structures and the one or more metal structures.

17. A composite structure according to claim 15, wherein the one or more metal structures is taller than the one or more dielectric structures.

* * * * *